United States Patent
Pinarbasi

(10) Patent No.: US 6,413,380 B1
(45) Date of Patent: Jul. 2, 2002

(54) METHOD AND APPARATUS FOR PROVIDING DEPOSITED LAYER STRUCTURES AND ARTICLES SO PRODUCED

(75) Inventor: Mustafa Pinarbasi, Morgan Hill, CA (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/638,645

(22) Filed: Aug. 14, 2000

(51) Int. Cl.[7] ............................................. C23C 14/34
(52) U.S. Cl. ......................... 204/192.11; 204/298.04; 204/298.26
(58) Field of Search ................ 204/192.11, 298.04, 204/298.26, 298.12, 298.15

(56) References Cited

U.S. PATENT DOCUMENTS

| | | | |
|---|---|---|---|
| 3,925,187 A | | 12/1975 | Bernard |
| 4,581,118 A | * | 4/1986 | Class et al. ............ 204/298.16 |
| 4,599,135 A | | 7/1986 | Tsunekawa et al. |
| 4,800,100 A | | 1/1989 | Herbots et al. |
| 4,866,032 A | * | 9/1989 | Fujimori et al. ............ 505/476 |
| 4,951,601 A | | 8/1990 | Maydan et al. |
| 5,106,821 A | * | 4/1992 | Homma et al. ............ 505/476 |
| 5,292,393 A | | 3/1994 | Maydan et al. |
| 5,466,665 A | * | 11/1995 | Yoshida et al. ............ 505/476 |
| 5,492,605 A | * | 2/1996 | Pinarbasi ............ 204/192.11 |
| 5,738,770 A | * | 4/1998 | Strauss et al. ......... 204/298.12 |
| 5,783,262 A | | 7/1998 | Chaiken et al. |
| 5,871,622 A | * | 2/1999 | Pinarbasi ............ 204/192.11 |
| 5,882,165 A | | 3/1999 | Maydan et al. |

FOREIGN PATENT DOCUMENTS

| | | | | |
|---|---|---|---|---|
| JP | 01 051 682 A | * | 2/1989 | |
| JP | 03 103 308 A | * | 9/1989 | ............ 204/298.04 |
| JP | 3-97210 | | 4/1991 | |
| JP | 11-120529 | | 4/1999 | |

* cited by examiner

Primary Examiner—Nam Nguyen
Assistant Examiner—Gregg Cantelmo
(74) Attorney, Agent, or Firm—Oppenheimer, Wolff, & Donnelly

(57) ABSTRACT

A merged ion beam and plasma vapor deposition chamber and associated manufacturing process are disclosed in which thin film depositions occur in a merged deposition chamber. The chamber utilizes both ion beam and RF/DC magnetron sputtering in a single chamber. The deposition of the layers can occur in the chamber without substrate transfer in a low vacuum, eliminating the need for multiple chambers and associated timely wafer transfer steps. The result is a film deposition and growth process which utilizes the advantages unique to each of the RF/DC and IBD processes without the film degradation that occurs in robot wafer transfer chambers found in combination systems known in the art.

11 Claims, 3 Drawing Sheets

METHOD AND APPARATUS FOR PROVIDING DEPOSITED LAYER STRUCTURES AND ARTICLES SO PRODUCED

BACKGROUND OF THE INVENTION

1. Field of the Invention

This invention relates in general to the deposition and growth of materials on substrates. More specifically, the invention relates to a method and associated apparatus that rapidly and consistently produces deposited layers having improved film properties using ion beam deposition in combination with DC and RF sputtering.

2. Description of Related Art

Known giant magnetoresistive (GMR) read/write heads are composed of multiple thin films, including a sensing layer, a pinned layer, and an exchange layer. GMR heads have been increasingly utilized in recent years because of their spin valve effect, which significantly increases data read/write rates and densities. A spin valve, in general, consists of a GMR trilayer with layers as described above. The sensing layer is magnetically soft, or very sensitive to small fields. The pinned layer is made magnetically hard, such that it is insensitive to fields of moderate size. The magnetic orientation of the pinned layer is fixed and held in place by the adjacent exchange layer, while the magnetic orientation of the sensing layer changes in response to the changing magnetic field of the disk. A sandwich structure of this type, having two ferromagnetic layers separated by a nonmagnetic metallic layer with the magnetization of one of the ferromagnetic layers pinned, constitutes a spin valve magnetoresistive sensor (SVMR). As the soft free layer moves in response to applied fields, the resistance of the whole structure will vary. This is known as the spin valve effect, and it renders GMR heads highly sensitive to magnetic fields from the disk. The increased sensitivity translates to detection of smaller recorded bits at higher data rates than are normally realized, making GMR heads favorable in the development of read/write technologies.

In the manufacture of thin film magnetic recording heads or disks, various prior art methods are used to deposit series of layers on a substrate disc. These known methods can include electroplating, thermal evaporation, chemical vapor deposition (CVD), molecular beam epitaxy (MBE), ion beam deposition (IBD) and physical vapor deposition (PVD), among others. PVD involves acceleration of ions from plasma toward a target. Bombardment with the ions releases material from the target which is then deposited on the disc, or wafer. A common PVD method is known as cathodic sputtering.

In known sputtering processes, a target made of the deposition material is aligned with the substrate in a sputtering chamber. A gas, for example argon, is introduced into the sputtering chamber where it is ionized and the resultant ionized particles accelerate toward the target, which has a negative bias applied to it. The ion bombardment causes some of the target material to break off, or sputter, from the target. The sputtered material is directed to the substrate and deposited thereon.

There are two common sputtering methods known in the art: DC magnetron and radio frequency (RF). In DC magnetron sputtering, a negative DC voltage is applied to the target. A magnetic field confines the plasma to the target. DC magnetron sputtering yields favorable sputtering rates that are relatively high and produce deposited films quickly, but has limited target utilization as only portions of the targets are activated. In contrast, RF sputtering, which may be carried out with or without the presence of a magnetic field, applies a radio frequency voltage to the target and/or to the substrate to achieve a net negative bias on the target. While RF sputtering yields higher target utilization, the sputtering rates are much lower and hence deposit film layers more slowly. In fact, DC magnetron has a deposition rate up to 50% higher than that of RF magnetron.

Long known drawbacks common to both DC and RF sputtering include the presence and buildup of plasma around the target and the substrate, and contamination of the chamber. Plasma buildup lowers the efficiency of sputtering and may also contaminate the layers. In the sputtering methods, plasma is in contact with the target and substrate and is, therefore, strongly influenced by it. Any changes to the target surface or substrate, which are difficult to control, affect the plasma and, therefore, also affect the properties of the film. Furthermore, plasma can be influenced by the substrate magnetic fields used to orient the magnetic field during deposition.

A prior art method that avoids the complexities known in the art, including plasma buildup and those previously described, is ion beam deposition (IBD). IBD is a materials growth technique in which thin films are deposited onto a substrate from a target, using low energy ions. IBD uses lower operating pressure which results in less impurity incorporation in the deposited films and less scattering of sputtered particles. Also, the plasma is confined in the ion gun, and the ions are directed only to the target area, avoiding contamination of the chamber and buildup of plasma. This avoids complexities created by plasma target and substrate plasma interactions.

While conventional IBD separates plasma from target and substrate, limits cross contamination of target materials and overcomes other disadvantages associated with RF and DC magnetron sputtering, it too has its own drawbacks. Although an ion source used in IBD may be used for the deposition of any material, the deposited materials have higher energies in comparison with conventional RF/DC sputtering. In ion beam sputtering, the deposited particles are not thermalized, while RF/DC deposited particles have lower energy due to scattering. Clearly, both RF/DC and IBD have unique advantages and disadvantages.

More recently, mixture type spin valve deposition systems are known in the art that utilize both IBD and RF and DC sputtering processes. These systems seek to utilize the advantages of both types of material deposition. The film structures produced by these combined systems are contemplated to have improved spin valve characteristics. However, the known mixture type systems also have inherent limitations of their own. The mixture type systems utilize separate chambers for the different deposition processes. In the mixed system, the two type chambers (ion and conventional RF or DC) are connected by a robot chamber. Between layer depositions in either of the deposition chambers, the substrates travel on a robot arm through the interconnecting robot chamber. Travel between the two deposition chambers typically lasts between 3 and 5 minutes.

In very high vacuum research systems, base pressures in the vacuum chamber are in the $10^{-10}$ torr range. However, in development and manufacturing type systems, the robot chamber typically has a base pressure in the $10^{-7}$ torr range. At this pressure, some amount of background gas such as water vapor, inherently present in the atmosphere, is deposited on the surface during each minute that the substrate is in the robot chamber. The layers of background gas will degrade the film properties and reproducibility of film production results.

It is therefore a purpose of the present invention to improve the limitations inherent to known thin film deposition manufacturing methods. More specifically, it is a purpose of the present invention to eliminate the step of transfer between deposition chambers and the associated exposure of growing film structures to unsuitable base pressures currently in known multichamber deposition systems.

SUMMARY OF THE INVENTION

The method and apparatus of the present invention combine IBD and sputtering processes in a single chamber to create a new materials manufacturing system. The present invention substantially reduces and even can eliminate the problems associated with known multiple chamber deposition processing while utilizing various deposition methods to claim their various advantages. The Merged Spin Valve Deposition System (MSVDS) allows the manufacture of spin valve film structures by two or more separate deposition methods with the elimination of substrate travel in a low vacuum chamber. The invention truly maintains the benefits of the different known deposition methods while eliminating the use of multiple chambers, the exposure to undesirable, elevated base pressures, and the deleterious effects on growing film surfaces due to contamination during substrate travel. The invention also eliminates associated complexities, exposure, and production delays associated with it. Moreover, the invention allows a previously unknown high throughput process for the manufacture of deposited thin film layered structures.

The foregoing and other objects, features, and advantages of the present invention will be apparent from the following detailed description of the preferred embodiments which makes reference to several drawing figures.

DETAILED DESCRIPTION OF THE PREFERRED EMBODIMENT

In the following description of exemplary embodiments reference is made to the accompanying drawings which form a part thereof, and in which are shown by way of illustration specific embodiments in which the invention may be practiced. It is to be understood that other embodiments may be utilized and structural and functional changes may be made without departing from the scope of the present invention.

Figure 1:
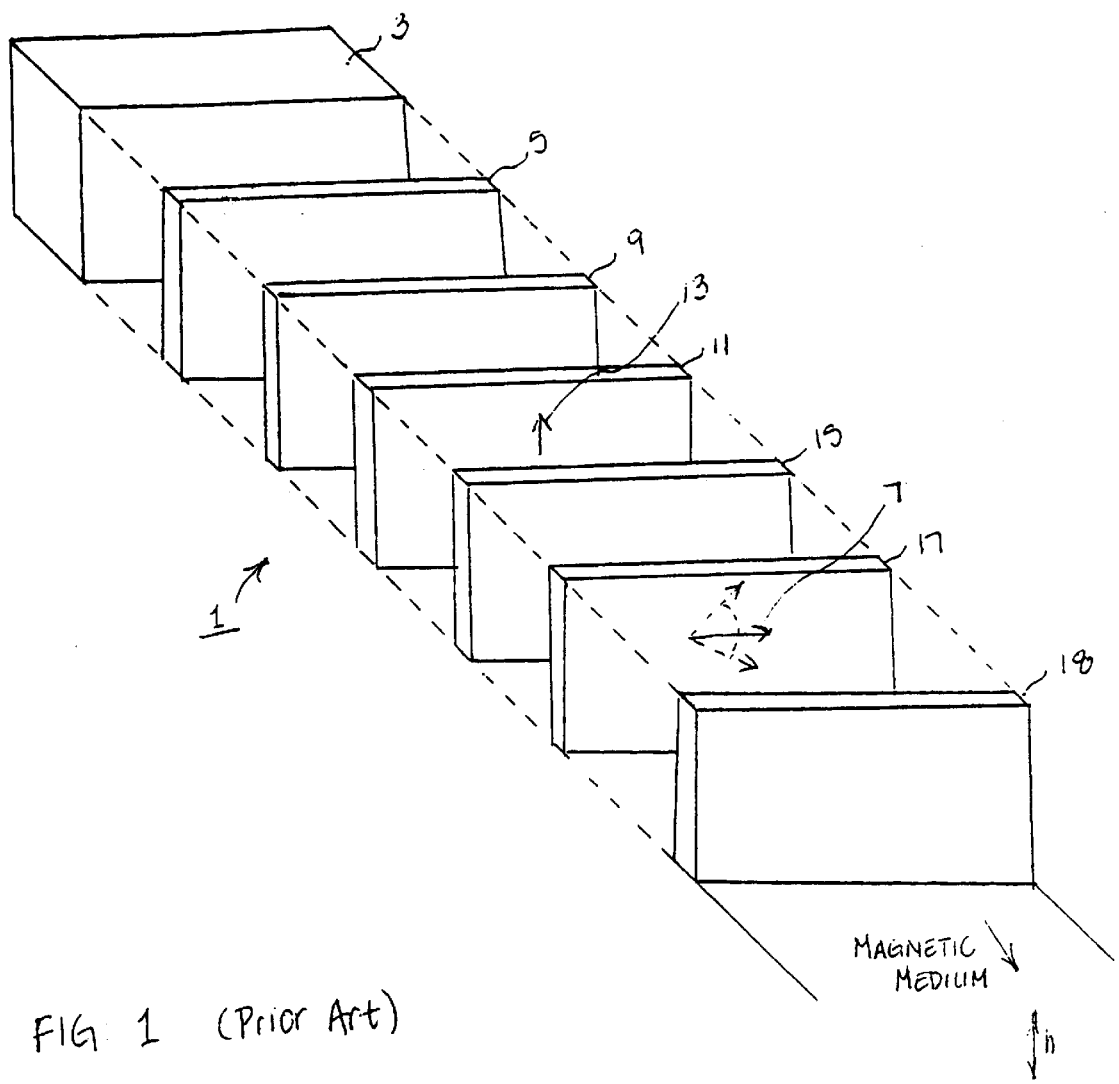
FIG. 1 is an exploded perspective view of a typical SVMR sensor illustrating its overall structure.

FIG. 1 illustrates a film structure 1 exemplary of SVMR read/write heads. The film layers are deposited on a substrate 3, and include a seed layer or oxide seed layer 5 that may be, for example, alumina, an exchange biasing or anti-ferromagnetic pinning layer 9, two ferromagnetic material layers 11 and 17 separated by a non ferromagnetic metallic spacer 15, and a protective layer 18, such as Ta. One of the ferromagnetic layers 17 is a free ferromagnetic layer; its magnetization is free to rotate its direction in response to an externally applied magnetic field. This freedom of magnetization is indicated by the rotating arrows 7. The other ferromagnetic layer 11 is a fixed ferromagnetic layer in that its magnetization is pinned. This is indicated by the stationary, fixed arrow at 13. The relative orientation of the magnetization of the free and fixed ferromagnetic layers 17 and 11, then, becomes altered according to changes in the externally applied magnetic field, as by a disk. The exchange biasing layer 9, adjacent the fixed ferromagnetic layer 11, is an anti-ferromagnetic material that acts to pin the magnetization of the fixed ferromagnetic layer.

SVMR film structures with the configuration shown in FIG. 1 such that the anti-ferromagnetic pinning layer is located near the substrate are considered to be of the inverted type. Non-inverted type SVMR film structures are characterized by the anti-ferromagnetic layer being located near the top of the structure. The present invention may be used in the deposition and growth of both types of film structures.

Figure 2:
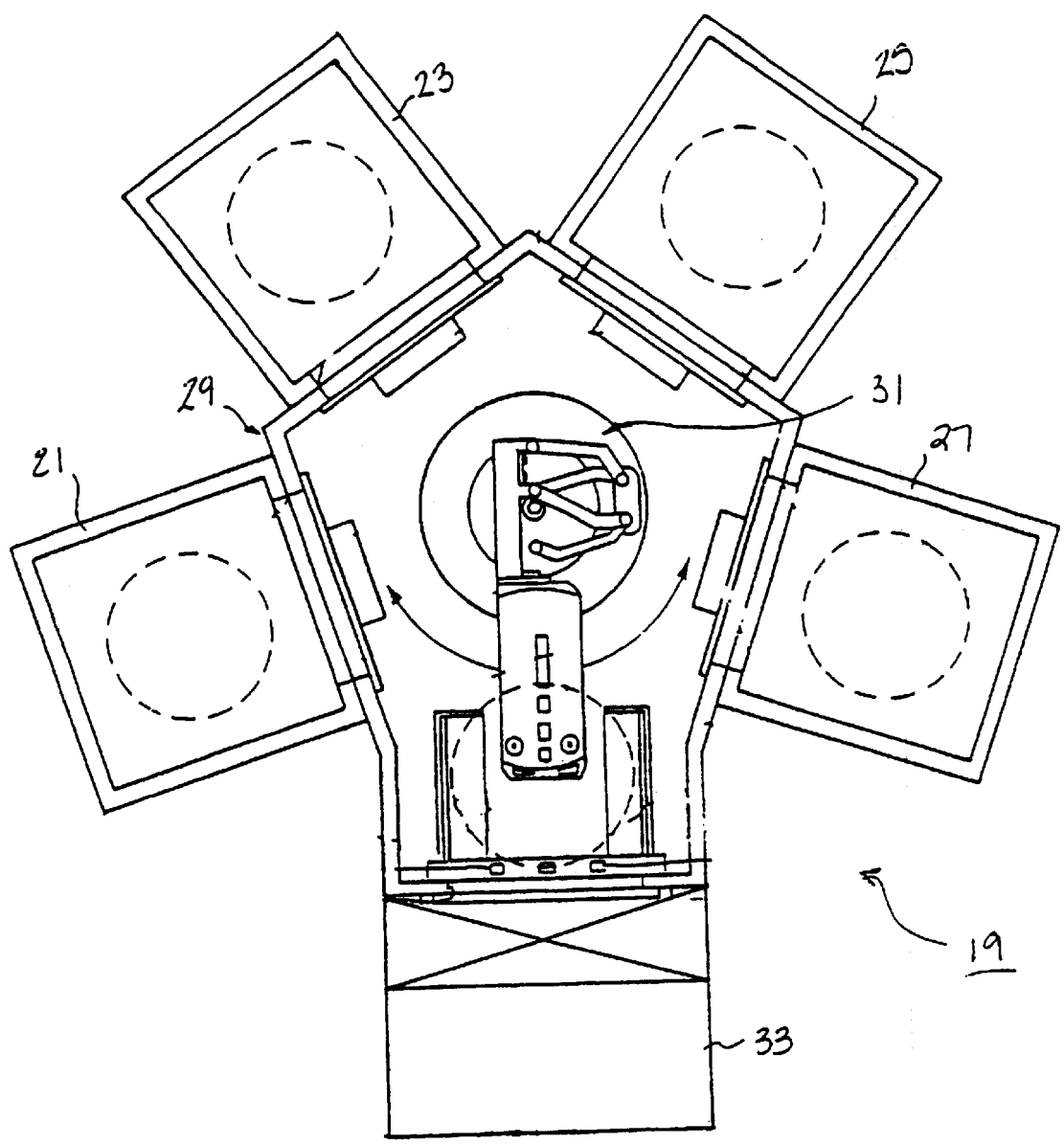
FIG. 2 is a diagram of a prior art deposition system comprising multiple chambers for different processes.

Deposition of the various layers of a film structure upon a wafer, or substrate, as shown in FIG. 1 and described previously, conventionally occurs in either a single chamber system utilizing a single deposition method, such as IBD, or in a multi-chamber system utilizing more than one deposition method, such as both IBD and PVD. For example, U.S. Pat. No. 5,882,165 discloses a mixed-type system 19 as shown in FIG. 2, with individual processing chambers 21 through 27 interconnected by a load lock chamber 29. The load lock chamber 29 houses a robot assembly 31 which moves a substrate into and out of the various chambers 21 through 27 such, that a single wafer may be acted upon by various processing methods in various individual chambers. The chambers may be suited for various types of processing, including etch, deposition, sputtering, and rapid thermal annealing. These chambers may each contain multiple targets. Sputtering techniques that may be used in a multi-chamber system may include IBD and PVD.

Multi-chamber systems, such as the one shown in FIG. 2, require transfer of a wafer between the various chambers 21 through 27. An example of the various chambers utilized by such a system may be a PVD chamber 21 and an IBD chamber 25. The wafer transfer occurs in an external chamber 29, and is typically achieved by a robot assembly 31. As explained previously, the transfer of a wafer between chambers 21 through 27 requires time and exposes the wafer to contamination in the load lock chamber 33 or robot chamber 29 that changes the surface of the growing film. The method and system of the present invention eliminate the need for a wafer transfer between IBD and PVD chambers through a transfer chamber.

Figure 3:
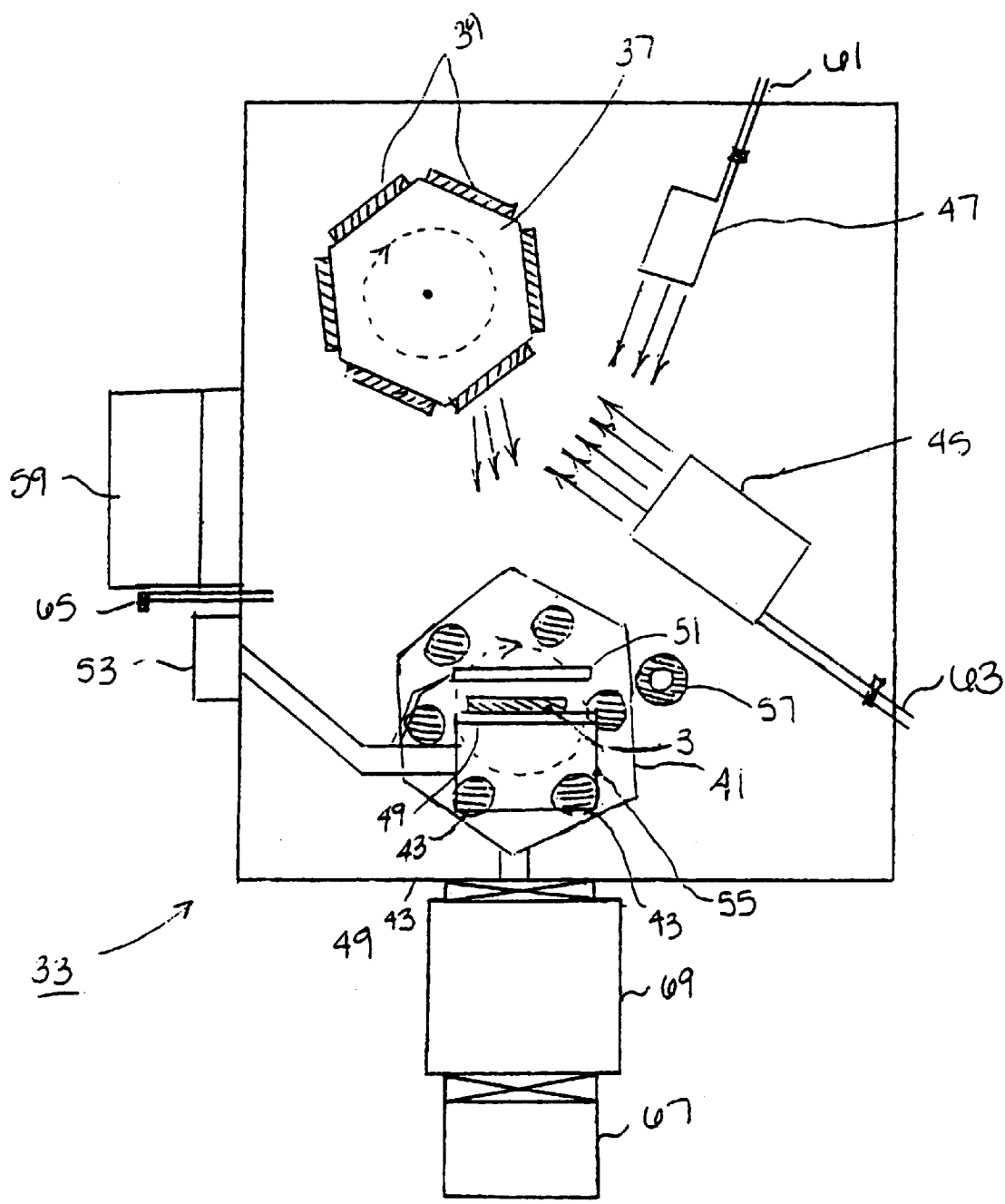
FIG. 3 is a plan view of a single chamber SVMR film deposition system illustrating the features of the present invention.

An exemplary system according to one embodiment of the present invention is shown in FIG. 3. The merged spin valve deposition chamber (MSVDC) 33 utilizes a single processing chamber 33 to house a wafer 3 which may undergo multiple processes during film growth. The MSVDC features a first rotatable target assembly 37 for IBD sputtering targets 39, and a second rotatable target assembly 41 for PVD targets 43. The chamber also includes an ion beam deposition gun 45 and a second ion gun 47 directed toward the substrate 3 which can be used as an ion assist gun or for sputter cleaning purposes, as well as the necessary equipment for PVD targets 43.

A process according to an embodiment of the present invention will be described with reference to an exemplary MSVDC system as shown in FIG. 3 used to grow a film as shown in FIG. 1. The wafer 3, which serves as the substrate in the deposition process, is inserted in the MSVDC 33 through a load lock chamber 67 and robot insertion chamber 69, mounted on a substrate holder 49 and situated behind a moveable shutter 51. The wafer 3 may be oriented at various angles on the wafer stage 55 by the wafer stage angle drive 53 and can be utilized for non-normal, or angled, IBD or PVD deposition. The exemplary process will utilize both IBD and PVD deposition for producing the various layers of the film structure. In a preferred embodiment, the operating pressure in the MSVDC 33 will be maintained between about $5 \times 10^{-5}$ torr and $5 \times 10^{-4}$ torr for IBD and between about $1 \times 10^{-3}$ torr and $1 \times 10^{-2}$ torr for PVD. Either of the deposition methods may be used to deposit any of the layers. The vacuum pressures will be maintained by an evacuation pump 59.

For layers deposited by IBD, the wafer 3 will be mounted horizontally on the wafer stage 55 that supports the substrate holder 49. The wafer stage 55 is then rotated such that the wafer 3 is vertically disposed. The moveable shutter 51 is moved to expose the wafer to a direction aligned with the IBD sputtering target 39. If desired, the ion assist gun 47 ejects Ar atoms onto the substrate 3 for a period of time to clean the substrate. For the layer deposition, the ion beam deposition gun 45 is turned on and ejects high energy ions, for example Xe+ ions, at a target 39 on the first rotatable target assembly 37. The shutter 51 may be closed for a period of time to protect the substrate 3 while the ion gun 45 cleans the sputtering target 39 surface. The shutter 51 will then open, exposing the substrate 3 to the path of sputtered atoms dislodged from the sputtering target 39 by the ions ejected from the ion gun 45. The thickness of the deposited layer can be measured by a quartz crystal thickness monitor 57, and when the appropriate thickness has been deposited on the substrate 3 the shutter 51 is moved in front of the substrate 3 and the ion beam gun 45 may be turned off. The first rotatable target assembly 37 may be rotated to place various sputtering targets such that they are properly aligned to deposit material on the substrate 3 and form the various layers. These targets may include, and are not limited to, aluminum (Al), permalloy (Ni—Fe), cobalt (Co), copper (Cu), ruthenium (Ru), tantalum (Ta), platinum manganese (PtMn) and iridium manganese (IrMn) among others. They can be utilized to deposit layers of alumina, anti-ferromagnetic material such as NiO for pinning the fixed ferromagnetic layer, non-ferromagnetic spacers such as Cu and Ru, ferromagnetic layers such as NiFe, and protective layers such as Ta. Other targets may be used to deposit other layers as necessary. Furthermore, other materials may be utilized to achieve the desired functionality of each deposited layer.

For layers deposited by PVD, the wafer 3 will be oriented in a horizontal position by the wafer stage angle drive 53, such that it is in the path of material deposited from overhead PVD targets 43 located on the second rotatable target 41. This horizontal positioning of the wafer may be accomplished by rotating the wafer stage 55 and shield 51 assembly, together, until the wafer 3 is aligned (although behind the shield 51) to receive depositions from the PVD targets 43. The PVD targets 43 may be of the same materials as those described for the IBD sputtering targets 39 and may be used as an alternative to deposit the same layers previously described. The cathode is turned on and the moveable shutter 51 is opened to expose the substrate 3. Material is then sputtered from the PVD target 43, selected from various targets mounted on the second rotatable target assembly 41, and deposited as layers on the substrate 3. In an embodiment of the invention, the layer deposition may be angled, such that the wafer stage 55 is situated at non normal angles during layer depositions, may be achieved with the PVD or IBD processes. The growth of the sputtered layer may be monitored by the quartz crystal thickness monitor, 57 and the cathode is turned off when the layer reaches the desired thickness. Alternatively, a second thickness monitor may be utilized such that each deposition method has its own dedicated thickness monitor. The moveable shutter 51 may also be shut to protect the film deposited on the substrate 3 until further layers are deposited.

The detailed description will continue with reference to an exemplary structure manufactured according to one embodiment of the present invention. An SVMR sensor of the inverted type, illustrated in FIG. 1 and having the anti-ferromagnetic layer 9 near the substrate 3, may be manufactured by a process according to an embodiment of the present invention as follows.

In the exemplary manufacturing process, IBD will be used to deposit a seed layer or oxide seed layer 5, such as alumina, on the substrate 3. An anti-ferromagnetic pinning layer 9, such as PtMn, will then be deposited, by IBD. The next layer 11, also deposited by IBD and without moving the wafer stage 55, is a pinned ferromagnetic layer and may be, for example, CoFe. The next layer 15, a spacer layer such as Cu, will be deposited by PVD. Alternatively, it may be deposited in two steps; the first half of the layer may be deposited by PVD and the second half of the layer by IBD. To alternate between the two deposition methods, the pressure in the MSVDC 33 is adjusted by the appropriate gas flow controllers, which control gas flowing into the system through the designated gas lines 61,63 and 65 such that it is at the proper range according to the deposition method. The substrate 3 is repositioned for the alternate methods by rotating the wafer stage 55 and shield 51 such that the wafer 3 is aligned with the appropriate sputtering targets 43. Following the deposition of the spacer layer 15, a free layer 17 is deposited by PVD. Alternatively, the free layer may be deposited by both PVD and IBD methods. For example, PVD may be used to deposit first portion of the layer and IBD may be used to deposit the rest of the layer. The free layer 17 may be, for example, NiFe and CoFe. Finally, a protective layer 18, such as Ta, is deposited by IBD or PVD.

Other layers or combinations of layers may be deposited in the MSVDC 33 according to different steps. For instance, either of the PVD or IBD methods may be used to deposit any of the layers in the previous example. Furthermore, combinations of PVD and IBD may be used to deposit a single layer. Also, different layers and different materials may be deposited in the MSVDC 33, and the layers may be deposited in any order, and at any angle. Similarly, variations to the method are also considered to fall within the scope and spirit of the present invention. For example, shapers, known in the art, may be attached to the system to improve the uniformity of the deposited films. Also, a magnetic field may be applied to the substrate during deposition for alignment of the easy axis of the magnetic field. Furthermore, a substrate bias may be applied to the wafer stage during deposition of the layers.

It is now apparent that the combination of both processes within a single merged deposition chamber 33 eliminates the need for intermediary transfer chambers and processing steps, thereby increasing product throughput and reducing the negative effects encountered by growing surfaces that are exposed to background gases and deleterious steps inherent in conventional combination-type systems.

The foregoing description of the preferred embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A merged ion beam and plasma vapor thin film deposition chamber comprising:

at least one ion beam deposition target module;

said at least one of the ion beam deposition target module having a plurality of ion beam deposition (IBD) targets;

at least one cathodic sputtering target module;

said at least one of the cathodic sputtering target module having a plurality of physical vapor deposition (PVD) targets;

a rotatable substrate positioned on a substrate holder for depositing material from the ion beam deposition targets and the physical vapor deposition targets thereon to form a plurality of films; and a movable shutter aligned with the substrate for precluding undesired deposition of the material from the ion beam deposition targets and the physical vapor deposition targets on the substrate during cleaning of the ion beam deposition target module and the cathodic sputtering target module.

2. The merged ion beam and plasma vapor thin film deposition apparatus of claim 1 wherein the at least one cathodic sputtering target module is positioned on top of the vacuum deposition chamber.

3. The merged ion beam and plasma vapor thin film deposition apparatus of claim 1 wherein the at least one cathodic sputtering target module is RF or DC convertible.

4. The merged ion beam and plasma vapor thin film deposition chamber according to claim 1, wherein the chamber further includes a measurement system for measuring the thickness of the films, said measurement system having a quartz crystal.

5. A method for the production of improved deposited thin film layers on a substrate, the method comprising:

providing a vacuum deposition chamber having at least one ion beam deposition target module having a plurality of ion beam deposition targets and at least one cathodic sputtering target module having a plurality of physical vapor deposition targets;

loading at least one substrate into the chamber;

aligning a shutter with the substrate during cleaning of the ion beam deposition target module and the cathodic sputtering target module;

depositing at least one first thin film layer on the substrate from the at least one ion beam deposition target module;

moving the substrate;

depositing at least one second thin film layer on the at least one first thin film layer from the at least one cathodic sputtering target module; and measuring the first and second film layer with a quartz crystal thickness monitoring system.

6. The method for the production of improved deposited thin film layers of claim 5, further comprising the additional step of, prior to depositing the at least one first thin film layer on the substrate, selecting and operating at least one of the plurality of ion beam deposition target modules.

7. The method for the production of improved deposited thin film layers of claim 5, further comprising the additional step of prior to depositing the at least one second thin film layer on the at least one first thin film layer, selecting and operating at least one of the plurality of cathodic sputtering modules.

8. The method for the production of improved deposited thin film layers on a substrate of claim 5 wherein the substrate is a wafer.

9. The method for the production of improved deposited thin film layers of claim 5 further comprising the step of improving uniformity of the deposited film layers.

10. The method for the production of improved deposited thin film layers of claim 5, further comprising the additional step of applying a magnetic field to the substrate during the deposition of at least one of the first and second thin film layers.

11. The method for the production of improved deposited thin film layers of claim 6, further comprising the additional step of applying a substrate bias to the substrate during the deposition of at least one of the first and second thin film layers.

* * * * *